United States Patent
Holmes et al.

(10) Patent No.: US 11,174,545 B2
(45) Date of Patent: Nov. 16, 2021

(54) OBLIQUE DEPOSITION FOR QUANTUM DEVICE FABRICATION

(71) Applicant: International Business Machines Corporation, Armonk, NY (US)

(72) Inventors: Steven J. Holmes, Ossining, NY (US); Devendra K. Sadana, Pleasantville, NY (US); Stephen W. Bedell, Wappingers Falls, NY (US); Ning Li, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 83 days.

(21) Appl. No.: 16/675,920

(22) Filed: Nov. 6, 2019

(65) Prior Publication Data
US 2021/0130944 A1 May 6, 2021

(51) Int. Cl.
*C23C 14/22* (2006.01)
*B82Y 10/00* (2011.01)
(Continued)

(52) U.S. Cl.
CPC ............ *C23C 14/225* (2013.01); *B82Y 10/00* (2013.01); *C23C 14/044* (2013.01); *G06N 10/00* (2019.01);
(Continued)

(58) Field of Classification Search
CPC .... C23C 14/225; C23C 14/044; G06N 10/00; H01L 27/18; H01L 21/02491; H01L 21/02639; H01L 21/0245; B82Y 10/00
See application file for complete search history.

(56) References Cited

U.S. PATENT DOCUMENTS 5,869,846 A * 2/1999 Higashino ............. H01L 39/225
257/31
5,899,734 A 5/1999 Lee
(Continued)

FOREIGN PATENT DOCUMENTS

CN 101567521 A 10/2009
CN 101567521 B 2/2011
(Continued)

OTHER PUBLICATIONS

Sarma et al., Majorana zero modes and topological quantum computation, npj Quantum Information, Oct. 27, 2015.
(Continued)

*Primary Examiner* — Kyoung Lee
*Assistant Examiner* — Christina A Sylvia
(74) *Attorney, Agent, or Firm* — Garg Law Firm, PLLC; Rakesh Garg; Douglas Pearson

(57) ABSTRACT

In an embodiment, a fabrication method comprises forming first and second electrodes over a substrate that includes a nanowire that extends between, and beneath portions of, the first and second electrodes. The method also includes forming a mask structure that defines at least one opening over a portion of the nanowire and defines at least one overhang portion over a gap between the substrate and the mask. The method further includes depositing a first gate electrode on the substrate and overlapping a third region of the nanowire, and depositing a second gate electrode on the substrate and overlapping a fourth region of the nanowire. The depositing of the first gate electrode includes depositing conductive material through the at least one opening from a first oblique angle, and the depositing of the second gate electrode includes depositing conductive material through the at least one opening from a second oblique angle.

20 Claims, 19 Drawing Sheets

(51) Int. Cl.
*C23C 14/04* (2006.01)
*G06N 10/00* (2019.01)
*H01L 21/02* (2006.01)
*H01L 27/18* (2006.01)

(52) U.S. Cl.
CPC .... *H01L 21/0245* (2013.01); *H01L 21/02491* (2013.01); *H01L 21/02639* (2013.01); *H01L 27/18* (2013.01)

(56) References Cited

U.S. PATENT DOCUMENTS

| | | | | |
|---|---|---|---|---|
| 6,979,836 | B2* | 12/2005 | Zagoskin | B82Y 10/00 |
| | | | | 257/31 |
| 7,749,784 | B2 | 7/2010 | Lin | |
| 8,301,214 | B1* | 10/2012 | Tolpygo | H01L 39/223 |
| | | | | 505/190 |
| 9,385,294 | B2* | 7/2016 | Rigetti | H01L 39/2493 |
| 2015/0187840 | A1* | 7/2015 | Ladizinsky | H01L 27/18 |
| | | | | 257/32 |
| 2018/0052806 | A1 | 2/2018 | Hastings et al. | |
| 2018/0053809 | A1 | 2/2018 | Freedman et al. | |

FOREIGN PATENT DOCUMENTS

| | | |
|---|---|---|
| KR | 20070025427 A | 3/2007 |
| WO | 2008002326 A2 | 1/2008 |
| WO | 2014152509 A1 | 9/2014 |
| WO | 2017217961 A1 | 12/2017 |

OTHER PUBLICATIONS

Jorgensen et al., Critical Current 0—π Transition in Designed Josephson Quantum Dot Junctions, Nov. 1, 2018.

Szombati et al., Josephson $\varphi$ 0-junction in nanowire quantum dots, 2019.

Liu et al., Detecting a Majorana-Fermion Zero Mode Using a Quantum Dot, Department of Physics, Duke University, Box 90305, Durham, North Carolina 27708-0305, USA, Nov. 1, 2018.

Zhang et al., Semiconductor quantum computation, National Science Review, Oxford University Press on behalf of China Science Publishing & Media Ltd, Dec. 22, 2018.

Nakamura et al., Coherent control of macroscopic quantum states in a single-Cooper-pair box, Feb. 1, 2008.

Van Dam et al., Supercurrent reversal in quantum dots, 2019.

Sato et al., Majorana Fermions and Topology in Superconductors, Journal of the Physical Society of Japan 85, 072001, Jun. 2, 2016, http://doi.org/10.7566/JPSJ.85.072001.

* cited by examiner

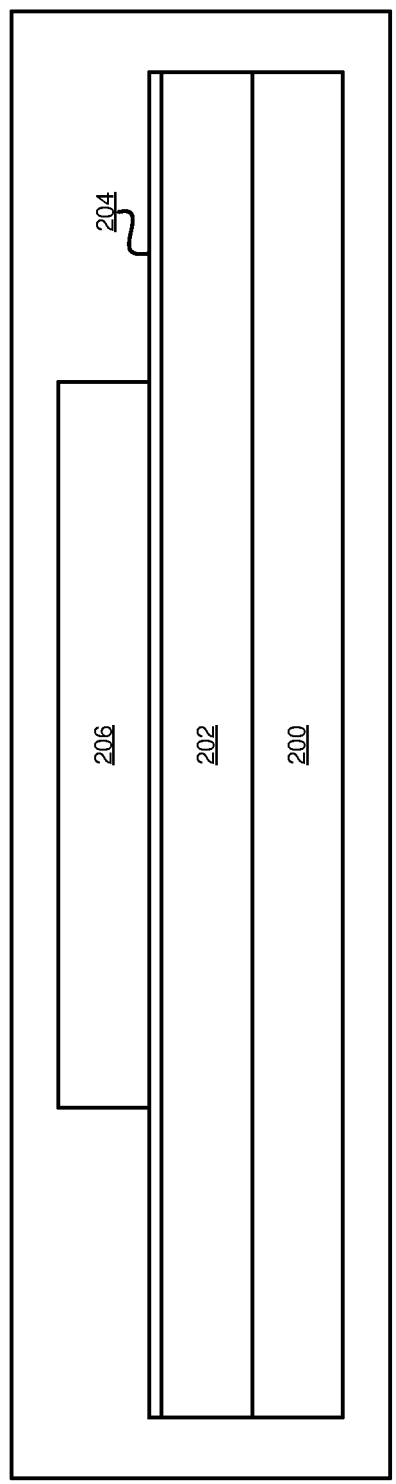

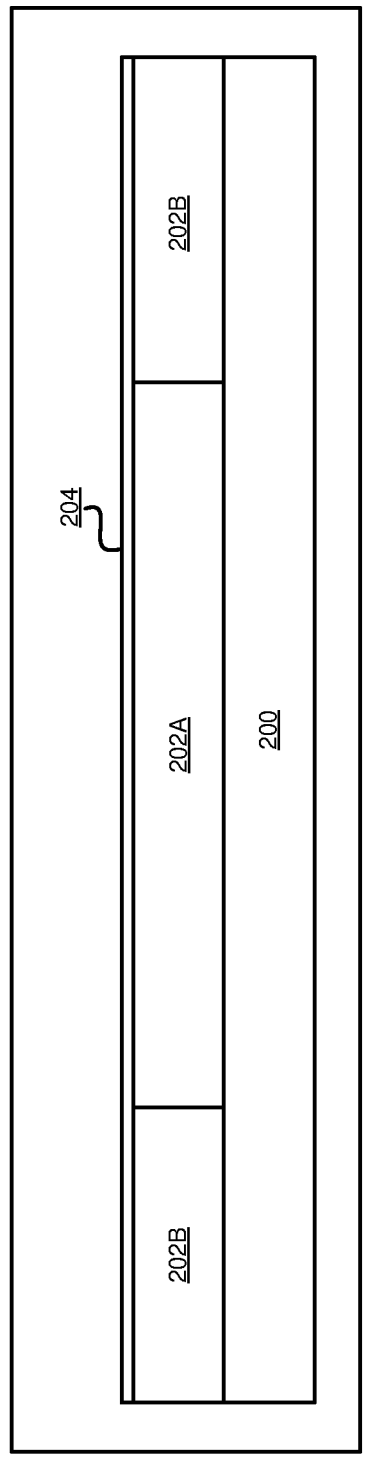

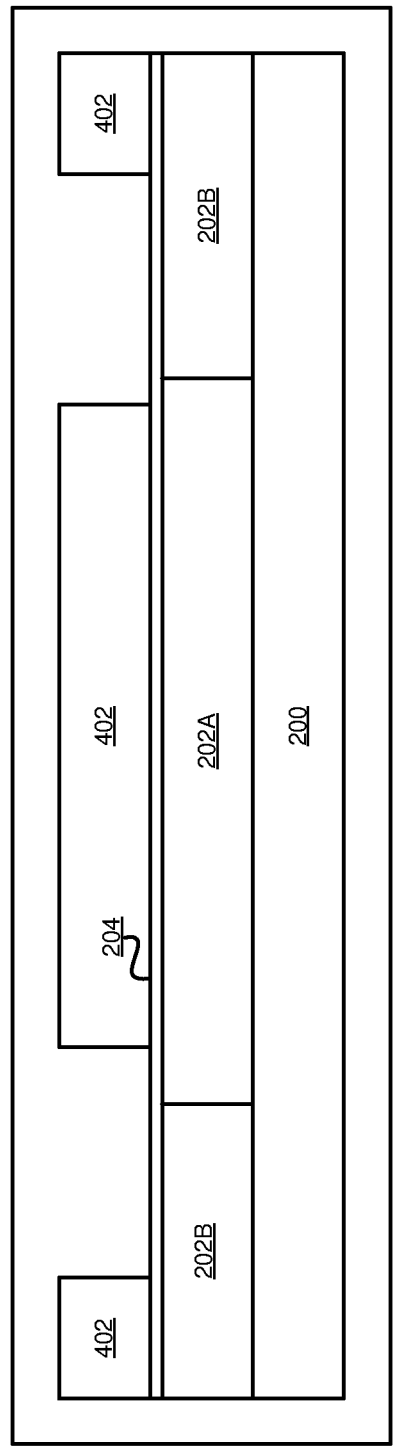

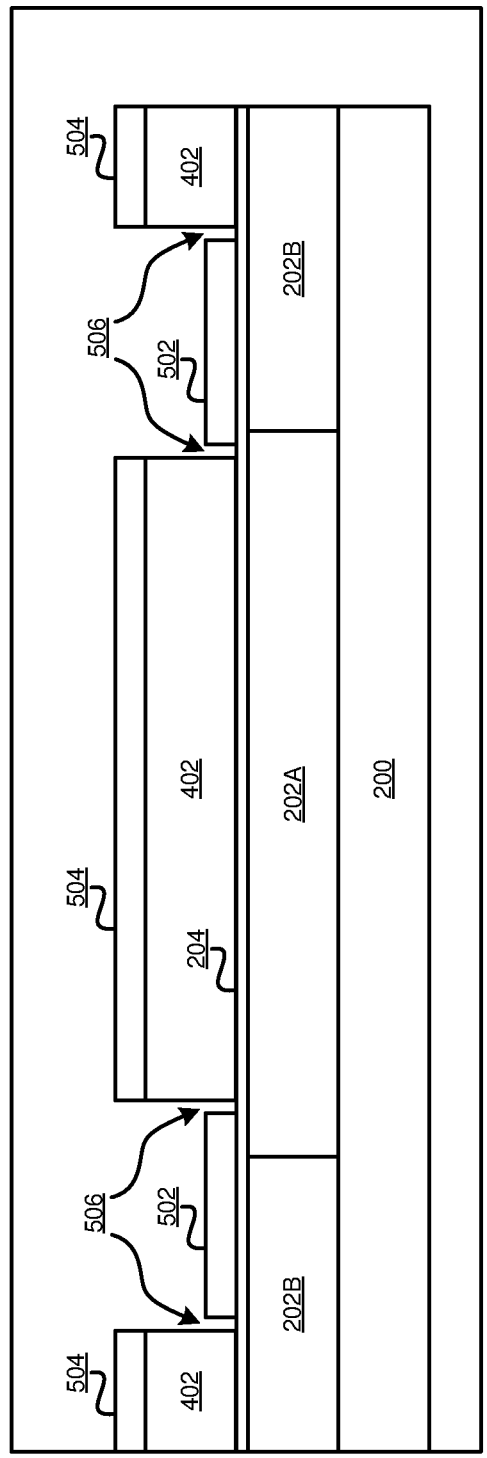

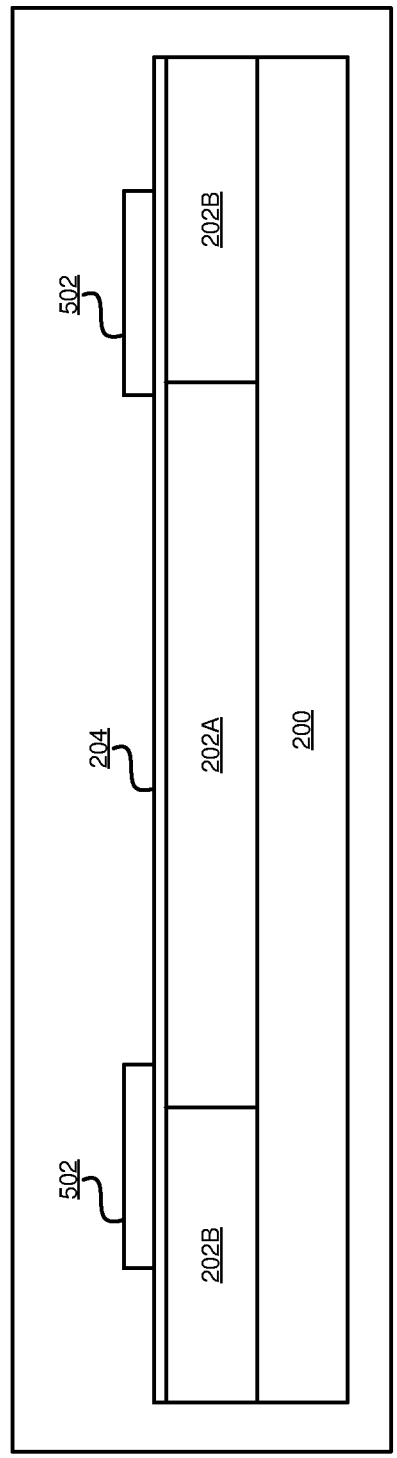

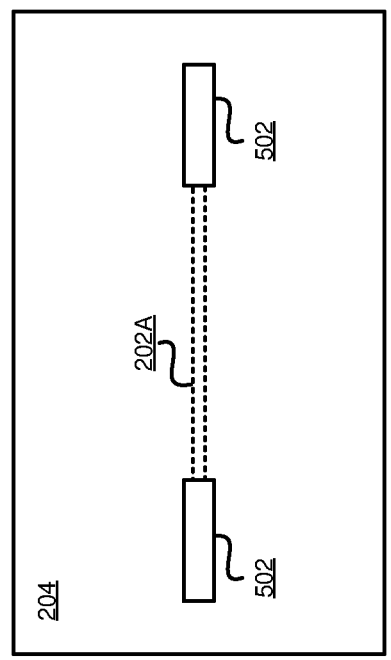

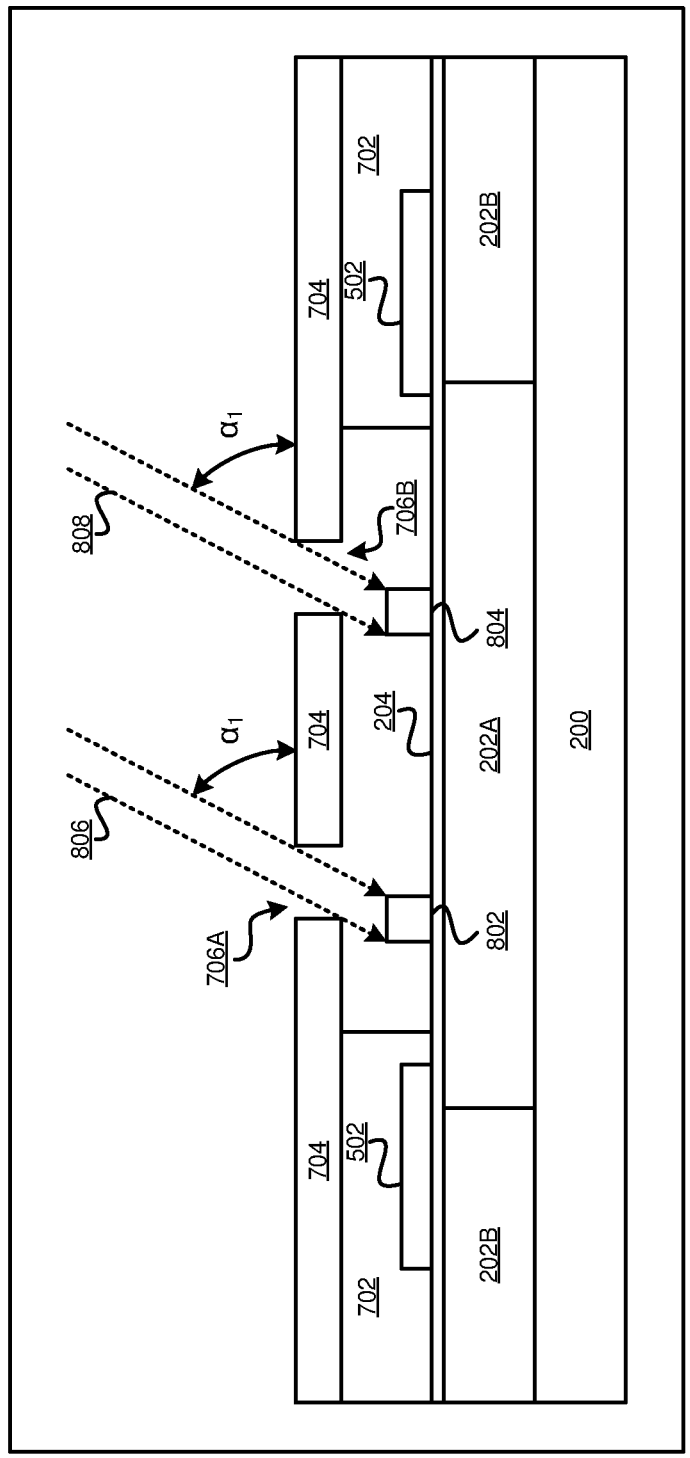

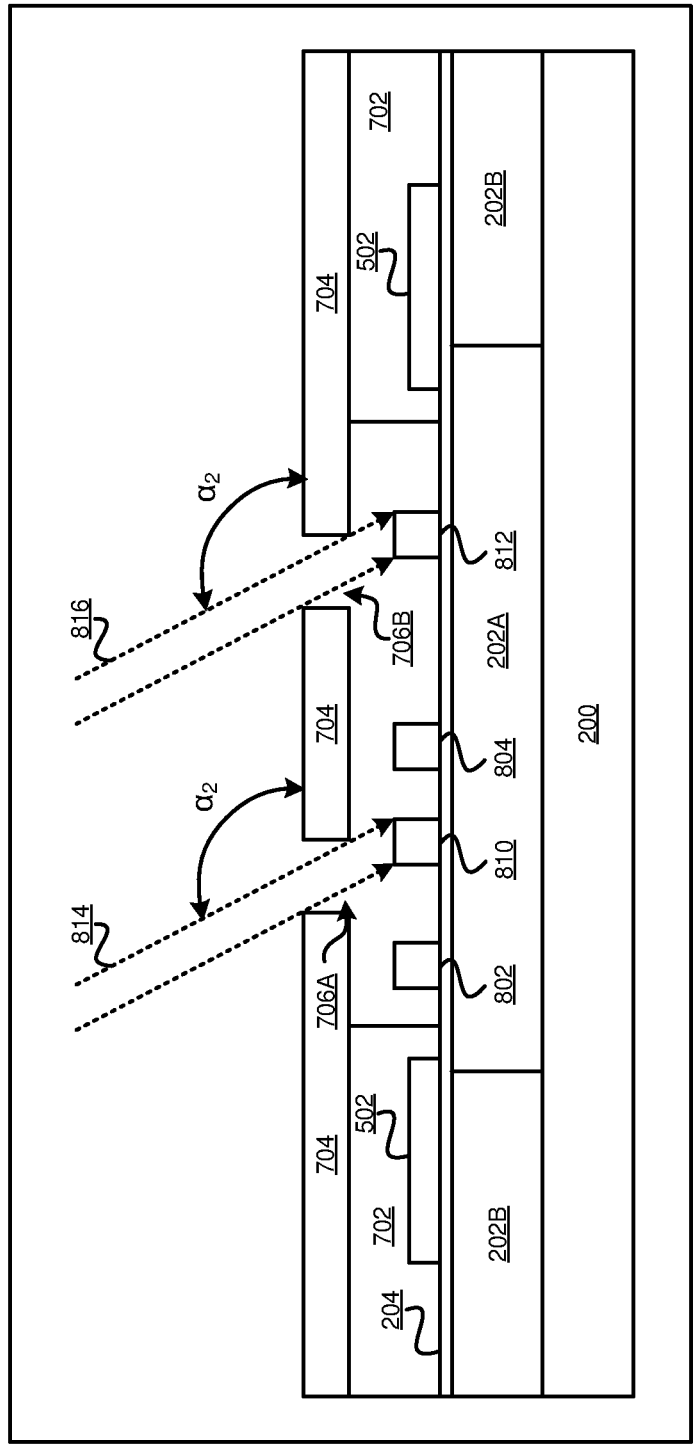

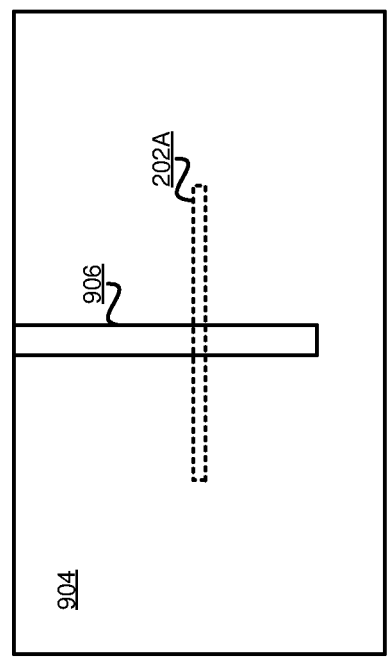

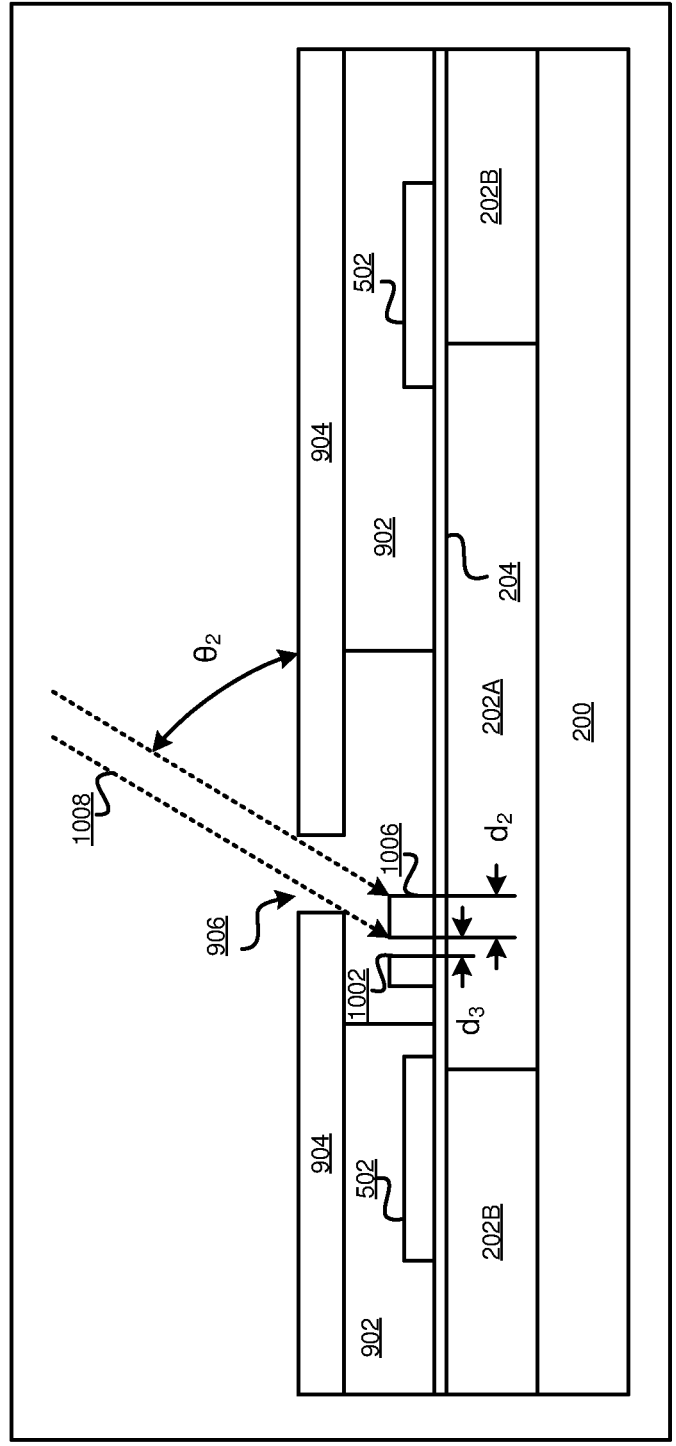

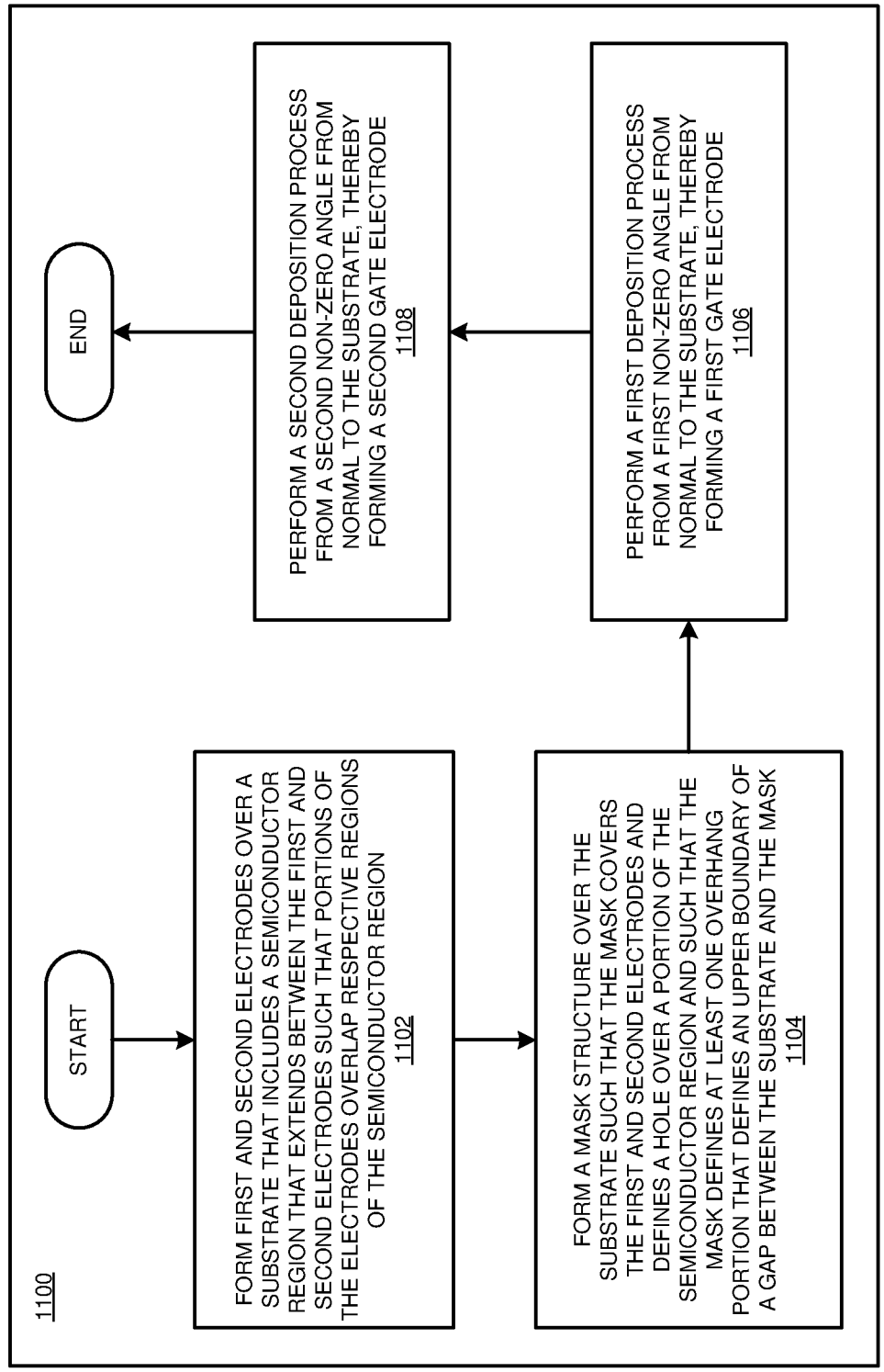

OBLIQUE DEPOSITION FOR QUANTUM DEVICE FABRICATION

TECHNICAL FIELD

The present invention relates generally to fabrication of quantum devices. More particularly, the present invention relates to oblique deposition for quantum device fabrication.

BACKGROUND

Hereinafter, a "Q" or "q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits) to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor (IBM is a registered trademark of International Business Machines corporation in the United States and elsewhere abroad.)

A qubit may include a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a superconducting qubit, the Josephson junction—which has a small inductance—is electrically coupled in parallel with one or more capacitive devices forming a nonlinear resonator.

One example of a Josephson junction includes a quantum dot, which is a small gap between gating electrodes, where the distance between the gating electrodes can be on the order of tens of nanometers or less. A quantum dot can be formed in a monolayer of a semiconductor material, such as Indium arsenide (InAs). Quantum dots can also be formed in indium gallium arsenide, as indium arsenide dots sitting in the gallium arsenide matrix. Quantum dots are useful for a variety of applications, including a range of types of quantum circuits, such as Majorana Fermion circuits as sensing devices, or in squid devices, or in conjunction with Josephson junction qubits. In a Josephson junction, the gating electrodes can be used to open or close a conductive channel between the gating electrodes across the gap by trapping an electron in the gap or releasing the electron from the gap. For example, an electron can be pulled into the quantum dot by applying a potential on one of the gating electrodes to let one electron flow into the gap, and applying a voltage to the other electrode that prevents that electron from flowing out of the gap. Once an electron is trapped in the quantum dot, continuity is established through a cross-channel between the two gating electrodes.

SUMMARY

The illustrative embodiments provide for oblique deposition for quantum device fabrication. An embodiment includes forming first and second electrodes over a substrate that includes a nanowire that extends between the first and second electrodes, wherein portions of the first and second electrodes overlap respective first and second regions of the nanowire. The embodiment also includes forming a mask structure over the substrate and the first and second electrodes, wherein the mask structure defines at least one opening over a portion of the nanowire, and wherein the mask structure defines at least one overhang portion that defines a boundary of a gap between the substrate and the mask. The embodiment also includes depositing a first gate electrode on the substrate and overlapping a third region of the nanowire, wherein the depositing of the first gate electrode includes depositing conductive material through the at least one opening from a first oblique angle from a surface of the substrate. The embodiment further includes depositing a second gate electrode on the substrate and overlapping a fourth region of the nanowire, wherein the depositing of the second gate electrode includes depositing conductive material through the at least one opening from a second oblique angle from the surface of the substrate.

An embodiment includes a quantum device comprising a first and second gate electrodes deposited on a substrate and overlapping a region of a nanowire, where a dimension of at least one of the first gate electrode, the second gate electrode, and a gap between the first and second gate electrodes is based on at least one of a size of at least one opening defined by a mask structure temporarily formed over the substrate, a first oblique angle from a surface of the substrate used for depositing the first gate electrode through the at least one opening, and a second oblique angle from the surface of the substrate used for depositing the second gate electrode through the at least one openings.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 2A depicts a cross-sectional view of an intermediate structure that includes a nanowire mask in accordance with an illustrative embodiment;

FIG. 3 depicts a cross-sectional view of an intermediate structure that includes a nanowire in accordance with an illustrative embodiment;

FIG. 4A depicts a cross-sectional view of an intermediate structure that includes an electrode mask in accordance with an illustrative embodiment;

FIG. 5A depicts a cross-sectional view of an intermediate structure that includes an electrode mask and deposition layer in accordance with an illustrative embodiment;

FIG. 6A depicts a cross-sectional view of an intermediate structure that includes electrodes in accordance with an illustrative embodiment;

FIG. 6B depicts a plan view of an intermediate structure that includes electrodes in accordance with an illustrative embodiment;

FIG. 8A depicts a cross-sectional view of an intermediate structure undergoing a deposition process from a first oblique angle in accordance with an illustrative embodiment;

FIG. 8B depicts a cross-sectional view of an intermediate structure undergoing a deposition process from a second oblique angle in accordance with an illustrative embodiment;

FIG. 9B depicts a plan view of an intermediate structure that includes a second temporary structure to facilitate oblique deposition in accordance with an illustrative embodiment;

FIG. 10B depicts a cross-sectional view of an intermediate structure undergoing a deposition process from a second oblique angle in accordance with an illustrative embodiment; and FIG. 11 depicts a flowchart of an example process for fabricating a quantum device in accordance with an illustrative embodiment.

DETAILED DESCRIPTION

Figure 1:
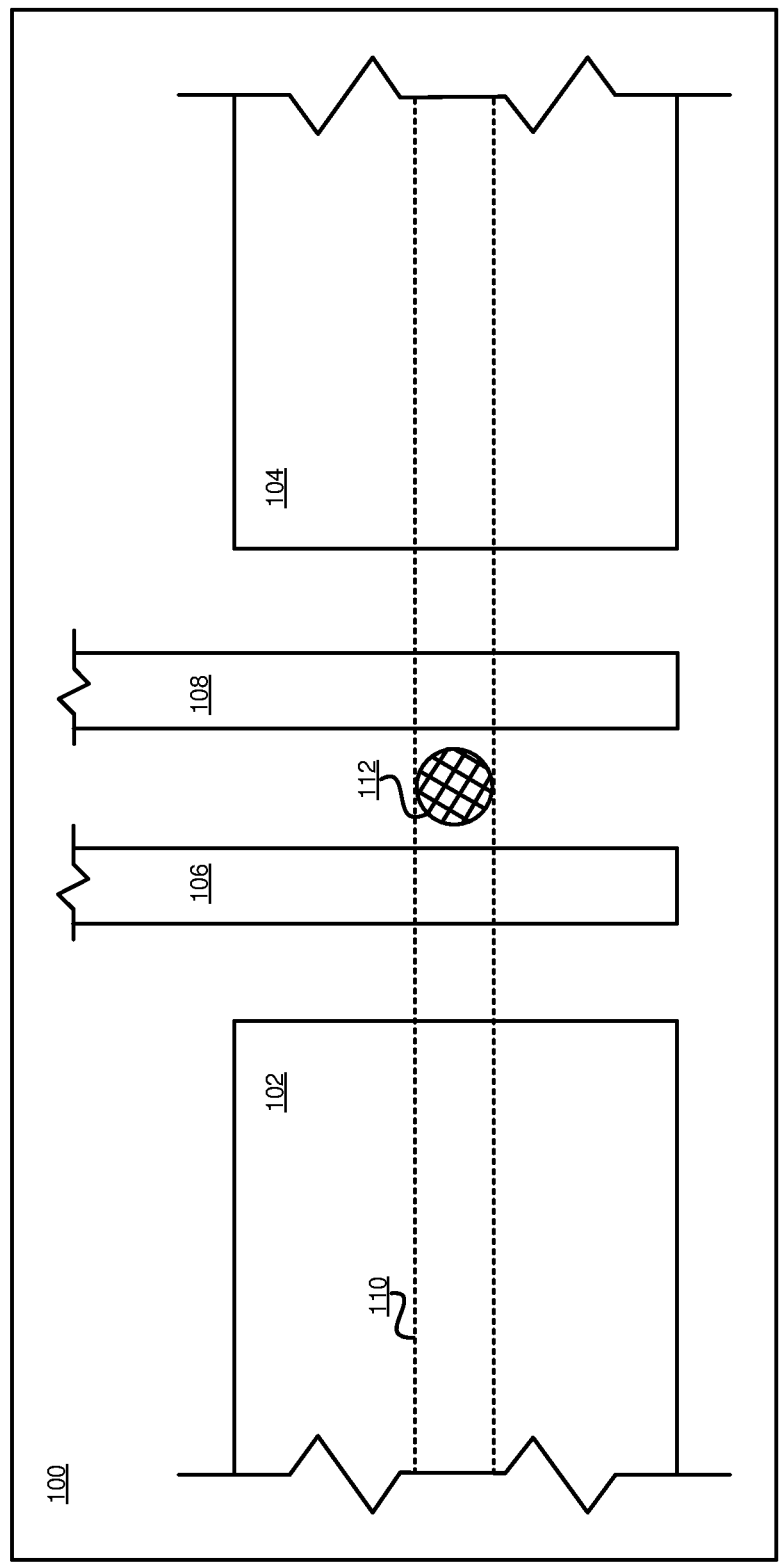
FIG. 1 depicts a plan view of a quantum device in which illustrative embodiments may be implemented.

The illustrative embodiments recognize that in order to minimize effectivity and optimize performance, it is desirable to improve the scaling of the quantum dot devices in terms of both the area of the gap, the width of the gating electrodes and the density of devices. The illustrative embodiments further recognize that achieving these goals is not a straight-forward matter because conventional methods of fabricating such structures are limited by the current semiconductor manufacturing process node and associated design rules. The meaning of a process node or technology node has evolved somewhat in recent years, but the general concept relates to the acknowledgement that there are practical limits to the size of the structures that semiconductor manufacturing tools can reliably form using conventional fabrication processes.

The illustrative embodiments recognize that there is a need to improve the fabrication processes that are used to form devices that feature a quantum dot by reducing the number of steps involved in the fabrication process. In general, the more steps there are in a fabrication process, the more susceptible the devices will be to inadvertent damage during the fabrication process. It is also desirable to reduce the number of steps in a fabrication process in order to reduce the complexity and expense involved in the process. Therefore, illustrative embodiments present fabrication processes that reduce the time, expense, and risk of damage involved in a fabrication process while allowing for the fabrication of quantum dot devices on a reduced scale that, in turn, allows for such devices to have improved precision for controlling electron flow in and out of the quantum dot region.

The illustrative embodiments include a fabrication process for fabricating a quantum device. In some embodiments, the process includes fabricating an intermediate (i.e., mid-process) structure that includes a substrate having a semiconductor layer, and a mask for defining conducting or non-conducting regions of the semiconductor layer. For example, in an embodiment, the mask covers a region of the semiconductor layer that will remain conductive and become a nanowire. The remaining, uncovered portions of the semiconductor layer is subjected to processing that reduces the conductivity of those portions of the semiconductor layer. In some embodiments, the substrate includes a bulk silicon wafer, a bulk germanium wafer, a bulk III-V wafer such as gallium arsenide or indium phosphide, a silicon on insulator (SOI) substrate, or a strained silicon on insulator (SSOI) substrate.

In some embodiments, the semiconductor layer includes a crystalline semiconductor material. Non-limiting examples of suitable materials for the crystalline semiconductor material of the substrate include group IV elements or compounds, such as Si (silicon), strained Si, SiC (silicon carbide), Ge (germanium), SiGe (silicon germanium), SiGeC (silicon-germanium-carbon), Si alloys, or Ge alloys, group III-V compounds, such as GaAs (gallium arsenide), InGaAs (indium gallium arsenide), $In_{0.7}Ga_{0.3}As$, InSb (indium antimonide), InAs (indium arsenide), InP (indium phosphide), or aluminum arsenide (AlAs), group II-VI compounds, such as CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride), or combinations thereof.

In some embodiments, the process providing the semiconductor layer having a thickness in a range suitable for a quantum dot, such as thicknesses less than 1000 nm. For example, in some embodiments, the process includes growing the semiconductor layer using molecular beam epitaxy (MBE) to the desired thickness. For example, some embodiments of the semiconductor layer have a thickness in a range from 1 nm to 500 nm, some embodiments of the semiconductor layer have a thickness in a range from 3 nm to 100 nm, some embodiments of the semiconductor layer have a thickness in a range from 5 nm to 50 nm, and some embodiments of the semiconductor layer have a thickness less than 10 nm, including thicknesses as small as practicable.

In the illustrative embodiment, the process includes forming an insulator layer as a capping layer over the semiconductor layer. In an embodiment, the insulator layer includes, for example, indium gallium arsenide, silicon dioxide, aluminum oxide, silicon nitride, or silicon carbide. In an embodiment, the process includes forming the insulator layer using a deposition process, such as chemical vapor deposition (CVD), plasma-enhanced chemical vapor deposition (PECVD), or low-pressure chemical vapor deposition (LPCVD).

In the illustrative embodiment, the process includes forming a mask on the insulator layer and over the semiconductor layer. In some embodiments, the mask includes an organic polymer. In some embodiments, the mask includes soft and/or hard mask materials. In some embodiments, the mask comprises an organic planarization layer (OPL). In some embodiments, the OPL includes a photo-sensitive organic polymer comprising a light-sensitive material that, when exposed to electromagnetic (EM) radiation, is chemically altered and thus configured to be removed using a developing solvent. For example, in some embodiments, the photo-sensitive organic polymer includes polyacrylate resin, epoxy resin, phenol resin, polyamide resin, polyimide resin, unsaturated polyester resin, polyphenylenether resin, polyphenylenesulfide resin, or benzocyclobutene (BCB).

In some embodiments, the process includes forming the mask over regions of the semiconductor layer that should remain conductive. In some embodiments, the process includes forming the mask over regions of the semiconductor layer that define a nanowire. In some embodiments, the process includes forming the mask over selected regions of the insulator layer using deposition, lithography, and etching. In some embodiments, the process includes forming the mask over the insulator layer using photolithography. In some embodiments, the process includes forming the mask over the insulator layer using microlithography for forming features smaller than 10 μm or nanolithography for forming features smaller than 100 nm. For example, in some embodiments, the process includes forming the mask by applying a photoresist layer, exposing the photoresist layer to a pattern of radiation, and then developing the pattern into the mask utilizing resist developer.

In the illustrative embodiment, the process includes defining a nanowire by surrounding the boundaries of the desired nanowire with non-conductive regions, followed by removal of the mask. In some embodiments, the process includes introducing a gaseous species through regions of the insulator layer and into regions of the semiconductor layer that are not covered by the mask. The gaseous species reacts with the regions of the semiconductor layer to create non-conductive regions, or at least reduce the conductivity of the regions. In some embodiments, the process includes removing the mask using a process that removes the material of the mask, for example wet etching processes, dry etching processes, or chemical-mechanical planarization (CMP) processes.

For example, in some embodiments, the process includes introducing the gaseous species into the unmasked regions of the semiconductor layer using ion implantation. In some embodiments, the gaseous species includes ions of hydrogen, helium, argon, krypton, and/or neon. In some embodiments, the gaseous species includes H+ ions. In some embodiments, the process includes introducing the gaseous species into the unmasked regions of the semiconductor layer using diffusion or plasma-assisted gasification, for example plasma hydrogenation.

In some embodiments, the process includes controlling the introduction of the gaseous species to penetrate completely through regions of the insulator layer and into regions of the semiconductor layer to a depth of at least half the thickness of the semiconductor layer. For example, in some embodiments, the process includes controlling the introduction of the gaseous species to penetrate into regions of the semiconductor layer to a depth of at least 75% of the thickness of the semiconductor layer, for example to a depth of at least 90% of the thickness of the semiconductor layer or to a depth of at least 99% of the thickness of the semiconductor layer. In some embodiments, the process includes controlling the introduction of the gaseous species to penetrate completely through regions of the insulator layer and completely through regions of the semiconductor layer.

In the illustrative embodiment, the process includes steps for forming electrodes over the insulator at opposing ends of the nanowire. The forming of the electrodes includes forming a mask on the insulator layer. In some embodiments, the mask includes an organic polymer. In some embodiments, the mask includes soft and/or hard mask materials. In some embodiments, the mask comprises an OPL. In some embodiments, the OPL includes a photo-sensitive organic polymer comprising a light-sensitive material that, when exposed to EM radiation, is chemically altered and thus configured to be removed using a developing solvent. For example, in some embodiments, the photo-sensitive organic polymer includes polyacrylate resin, epoxy resin, phenol resin, polyamide resin, polyimide resin, unsaturated polyester resin, polyphenylenether resin, polyphenylenesulfide resin, or benzocyclobutene (BCB).

In some embodiments, the process includes forming the mask over the insulator layer except for regions that define patterns for electrodes that will be formed on the insulator layer. In some embodiments, the process includes forming the mask over selected regions of the insulator layer using deposition, lithography, and etching. In some embodiments, the process includes forming the mask over the insulator layer using photolithography. In some embodiments, the process includes forming the mask over the insulator layer using microlithography for forming features smaller than 10 µm or nanolithography for forming features smaller than 100 nm. For example, in some embodiments, the process includes forming the mask by applying a photoresist layer, exposing the photoresist layer to a pattern of radiation, and then developing the pattern into the mask utilizing resist developer.

In some embodiments, the process includes forming metal layers over the mask and on the insulator layer where there are voids in the mask. In some embodiments, the metal layers include aluminum (Al), titanium (Ti), tantalum (Ta), tungsten (W), titanium nitride (TiN), V (vanadium), Pb (lead), Sn (tin), Au (gold), Pd (palladium), or Pt (platinum). In some embodiments, the metal layer includes metal that is superconducting at cryogenic temperatures (i.e., temperatures below −180° C.). In some embodiments, the process includes depositing the metal layers on the mask and on regions of the insulator layer that are not covered by the mask. In some embodiments, the voids in the mask define regions where the electrodes are to be formed on the insulator layer. In some embodiments, the process forms the metal layers using evaporation, sputter, or other metal-deposition methods. In some embodiments, the process forms gaps in metal film continuity between the metal in the electrodes and the metal in the sacrificial structures to allow for easier removal of the mask and sacrificial structures by chemical etching.

In some embodiments, the process includes removing the mask and sacrificial metal layers on the mask using a lift-off process that removes the material of the mask, for example wet etching processes, dry etching processes, or chemical-mechanical planarization (CMP) processes. In some embodiments, the electrodes extend over respective regions of the nanowire to make contact through the insulator layer. For example, in some embodiments, the insulator layer thin enough to allow electrical contact therethrough.

In the illustrative embodiment, the process includes steps for forming gating electrodes over the insulator layer over the nanowire for a quantum dot. The forming of the gating electrodes includes oblique deposition through an opening in a temporary masking structure that is used in conjunction with the obliqueness to control the size and/or location of the gating electrodes. In the illustrative embodiment, the temporary structure comprises a sacrificial layer formed over the insulator layer, and a photoresist layer formed over the sacrificial layer and patterned to define openings. In some embodiments, the openings are patterned to allow for formation of gating electrodes.

In some embodiments, the sacrificial layer comprises one or more layers of developer-soluble bottom anti-reflective coating (DBARC) material formed on the insulator layer. In some embodiments, the process includes forming the sacrificial layer from two or more layers of sacrificial material that are sequentially deposited and processed. In some embodiments, process includes forming the sacrificial layer from one or more layers of 90 nm DBARC material, for example by spin coating or other deposition processes. In some embodiments, the photoresist layer includes any suitable commercially available photoresist material.

In some embodiments, the process includes photolithographically patterning the photoresist layer to form a photoresist mask having openings and isotropically etching away a portion of the sacrificial layer that is exposed through the openings of the photoresist layer to form overhang structures. In some embodiments, the process includes forming the photoresist layer using known techniques. For example, in some embodiments with a positive resist type, the process includes exposing a portion of the photoresist layer to UV light, for example, through a mask having transparent regions that define a target pattern of metallization lines/features. The portion of the photoresist layer that is exposed to light becomes soluble to a photoresist developer, whereas the portion of the photoresist that is unexposed to UV light remains insoluble to the photoresist developer. Following the exposure process, the photoresist layer is developed using a suitable photoresist developer solution. When the photoresist material is a positive resist type, the portion of the photoresist layer that was exposed to the UV light is dissolved by the photoresist developer solution.

In some embodiments, the process includes utilizing a photoresist developer solution to dissolve portions of the sacrificial layer that are exposed through the openings of the photoresist layer form the photoresist overhang structures. In some embodiments, the photoresist developer solution used to develop the photoresist layer is also used to dissolve the portions of the sacrificial layer. In some such embodiments, the process includes using the photoresist developer solution to develop the photoresist layer for a first period of time equivalent to the development time for development of the photoresist layer, then continuing to expose the structure to the photoresist developer solution for a second period of time following the development of the photoresist layer to allow the developer solution to dissolve the portions of the sacrificial layer that are exposed through the openings and form the photoresist overhang structures.

In some such embodiments, the process includes using a photoresist developer solution that isotropically etches the exposed portions of the sacrificial layer in all directions. As such, when the exposed portion of the sacrificial layer is vertically etched, the exposed portion of the sacrificial layer is also laterally etched to form the undercut regions in the sacrificial layer below the photoresist layer around a bottom periphery of the openings, thereby forming the photoresist overhang structures. In some embodiments, the isotropic etching forms curved sidewalls in the sacrificial layer.

In some embodiments, a first deposition process results in formation of both a first idle electrode and a first gating electrode on the insulator layer. In some embodiments, a second deposition process results in formation of both a second gating electrode and a second idle electrode on the insulator layer. In some embodiments, the electrodes are all gating electrodes and the resulting device has three quantum dots.

In some embodiments, the electrodes include metal, for example aluminum (Al), titanium (Ti), tantalum (Ta), tungsten (W), titanium nitride (TiN), V (vanadium), Pb (lead), Sn (tin), Au (gold), Pd (palladium), and Pt (platinum). In some embodiments, the process includes depositing the metal electrodes through the openings in the photoresist layer. More specifically, in some embodiments, the electrodes are formed concurrently during a first deposition process with the substrate plane or surface receiving the deposition being at a first angle $\alpha_1$ relative to a deposition direction, and the electrodes are formed concurrently during a second deposition process with the substrate plane or upper surface of the photoresist layer being at a second angle $\alpha_2$ relative to a deposition direction. In some embodiments, the angles $\alpha_1$ and $\alpha_2$ are supplementary angles, i.e., $\alpha_1+\alpha_2=180°$. In some embodiments, the angles $\alpha_1$ and $\alpha_2$ are not supplementary angles. In some embodiments, the process adjusts the angle of deposition by adjusting the angle of the substrate (e.g., tilting the substrate) while keeping the direction from which metal is deposited fixed. In some embodiments, the process adjusts the angle of deposition by adjusting the direction from which metal is deposited while keeping the angle of the substrate fixed. In some embodiments, the process adjusts the angle of deposition by adjusting both the direction from which metal is deposited and the angle of the substrate.

In some embodiments, the angles $\alpha_1$ and $\alpha_2$ are selected based on the desired size and placement of the electrodes. In some embodiments, the process includes adjusting the deposition angle relative to the upper surface of the photoresist layer in order to adjust the at least one dimension of the deposition window defined by the openings, and thereby adjust at least one dimension of the electrodes formed by the deposition process. For example, in an embodiment, for the angle $\alpha_1$ satisfying the condition $0° \leq \alpha_1 \leq 90°$, the width of the electrodes and gets smaller as the angle $\alpha_1$ gets smaller.

In some embodiments, the process includes controlling the locations of the electrodes by adjusting the deposition angles $\alpha_1$ and $\alpha_2$. For example, for a deposition angle set such that $\alpha_1=90°$, the resulting electrode would be formed on the insulator layer directly below the opening. As the angle $\alpha_1$ is reduced from 90° towards 0°, the resulting electrode location moves away from alignment with an opening and towards a position between the insulator layer and an overhang structure. Also, since the position of the electrodes can be controlled by adjusting the angles $\alpha_1$ and $\alpha_2$, the distance between the gating electrodes and can also be controlled by adjusting the deposition angles $\alpha_1$ and $\alpha_2$. For example, in some embodiments, the process controls the size of the gap between gating electrodes for a quantum dot by adjusting the angles used for the respective deposition angles $\alpha_1$ and $\alpha_2$. Thus, embodiments can finely control the size of the electrodes and/or the gap between electrodes by controlling the deposition angles.

In an embodiment, the process uses openings in the photoresist layer to form more than one electrode. For example, in some embodiments, a first opening is used to form a first electrode and then to form a second electrode, which are laterally spaced apart from each other on the insulator layer. Also, the opening is used to form electrode and then to form electrode, which are laterally spaced apart from each other on the insulator layer.

In an embodiment, the process includes steps for forming gating electrodes over the insulator layer over the nanowire for a quantum dot where a pair of gating electrodes are formed through a same opening of a same mask during different deposition processes. Thus, in some such embodiments, the forming of the gating electrodes includes oblique deposition through an opening in a temporary masking structure that is used in conjunction with the obliqueness to control the size and/or location of the gating electrodes. In the illustrative embodiment, the temporary structure comprises a sacrificial layer formed over the insulator layer, and a photoresist layer formed over the sacrificial layer and patterned to define openings. In some embodiments, the openings are patterned to allow for formation of gating electrodes. In an embodiment, a temporary structure comprises a sacrificial layer formed over the insulator layer, and a photoresist layer formed over the sacrificial layer and patterned to define an opening. In some embodiments, the opening is patterned to allow for formation of gating electrodes.

In some embodiments, the sacrificial layer comprises one or more layers of developer-soluble bottom anti-reflective coating (DBARC) material formed on the insulator layer. In some embodiments, the process includes forming the sacrificial layer from two or more layers of sacrificial material that are sequentially deposited and processed. In some embodiments, process includes forming the sacrificial layer from one or more layers of 90 nm DBARC material, for example by spin coating or other deposition processes. In some embodiments, the photoresist layer includes any suitable commercially available photoresist material.

In some embodiments, the process includes photolithographically patterning the photoresist layer to form a photoresist mask having an opening, and isotropically etching away a portion of the sacrificial layer that is exposed through the opening of the photoresist layer to form overhang structures. In some embodiments, the process includes forming the photoresist layer using known techniques. For example, in some embodiments with a positive resist type, the process includes exposing a portion of the photoresist layer to UV light, for example, through a mask having transparent regions that define a target pattern of metallization lines/features. The portion of the photoresist layer that is exposed to light becomes soluble to a photoresist developer, whereas the portion of the photoresist that is unexposed to UV light remains insoluble to the photoresist developer. Following the exposure process, the photoresist layer is developed using a suitable photoresist developer solution. When the photoresist material is a positive resist type, the portion of the photoresist layer that was exposed to the UV light is dissolved by the photoresist developer solution.

In some embodiments, the process includes utilizing a photoresist developer solution to dissolve portions of the sacrificial layer that are exposed through the opening of the photoresist layer and form the photoresist overhang structures. In some embodiments, the photoresist developer solution used to develop the photoresist layer is also used to dissolve the portions of the sacrificial layer. In some such embodiments, the process includes using the photoresist developer solution to develop the photoresist layer for a first period of time equivalent to the development time for development of the photoresist layer, then continuing to expose the structure to the photoresist developer solution for a second period of time following the development of the photoresist layer to allow the developer solution to dissolve the portions of the sacrificial layer that are exposed through the opening and form the photoresist overhang structures.

In some such embodiments, the process includes using a photoresist developer solution that isotropically etches the exposed portions of the sacrificial layer in all directions. As such, when the exposed portion of the sacrificial layer is vertically etched, the exposed portion of the sacrificial layer is also laterally etched to form the undercut regions in the sacrificial layer below the photoresist layer around a bottom periphery of the opening, thereby forming the photoresist overhang structures. In some embodiments, the isotropic etching forms curved sidewalls in the sacrificial layer rather than the squared sidewalls shown in the drawings.

The process includes performing the deposition processes to form electrodes. In some embodiments, the deposition process results in formation of a first gating electrode on the insulator layer. In some embodiments, the deposition process results in formation of a second gating electrode on the insulator layer. In some embodiments, the electrodes are gating electrodes and the resulting device has a quantum dot between the electrodes.

In some embodiments, the electrodes include metal, for example aluminum (Al), titanium (Ti), tantalum (Ta), tungsten (W), titanium nitride (TiN), V (vanadium), Pb (lead), Sn (tin), Au (gold), Pd (palladium), and Pt (platinum). In some embodiments, the process includes depositing the metal electrodes and through the opening in the photoresist layer. More specifically, in some embodiments, the electrode is formed during a first deposition process with the substrate plane or upper surface of the photoresist layer being at a first angle $\theta_1$ relative to a deposition direction, and the electrode is formed during a second deposition process with the substrate plane or upper surface of the photoresist layer being at a second angle $\theta_2$ relative to a deposition direction. In some embodiments, the process adjusts the angle of deposition by adjusting the angle of the substrate (e.g., tilting the substrate) while keeping the direction from which metal is deposited fixed. In some embodiments, the process adjusts the angle of deposition by adjusting the direction from which metal is deposited while keeping the angle of the substrate fixed. In some embodiments, the process adjusts the angle of deposition by adjusting both the direction from which metal is deposited and the angle of the substrate.

In some embodiments, the angles $\theta_1$ and $\theta_2$ are selected based on the desired size and placement of the electrodes. In some embodiments, the process includes adjusting the deposition angle relative to the upper surface of the photoresist layer in order to adjust the at least one dimension of the deposition window defined by the opening, and thereby adjust at least one dimension of the electrodes formed by the deposition process. For example, in the illustrated embodiment, for the angle $\theta_1$ satisfying the condition $0° \leq \theta_1 \leq 90°$, the width of the electrodes gets smaller as the angle $\theta_1$ gets smaller.

In some embodiments, the process includes controlling the locations of the electrodes by adjusting the deposition angles $\theta_1$ and $\theta_2$. For example, for a deposition angle set such that $\theta_1 = 90°$, the resulting electrode would be formed on the insulator layer directly below the opening. As the angle $\theta_1$ is reduced from 90° towards 0°, the resulting electrode location moves away from alignment with the opening and towards a position between the insulator layer and an overhang structure. Also, since the position of the electrodes can be controlled by adjusting the angles $\theta_1$ and $\theta_2$, the distance between the gating electrodes and can also be controlled by adjusting the deposition angles $\theta_1$ and $\theta_2$. For example, in some embodiments, the process controls the size of the gap between gating electrodes for a quantum dot by adjusting the angles used for the respective deposition angles $\theta_1$ and $\theta_2$. Thus, embodiments can finely control the size of the electrodes and/or the gap between electrodes by controlling the deposition angles.

In the illustrated embodiment, the process uses the opening in the photoresist layer to form more than one electrode. For example, the opening is used to form a first electrode and then to form a second electrode, which are laterally spaced apart from each other on the insulator layer.

With reference to the figures and in particular with reference to FIG. 1, these figures are example diagrams of structures and fabrication processes in which illustrative embodiments may be implemented. FIG. 1 is only an example and is not intended to assert or imply any limitation with regard to the environments in which different embodiments may be implemented. A particular implementation may make many modifications to the depicted environments based on the following description.

FIG. 1 depicts a plan view of a nanowire junction 100 as an example of a quantum device for which illustrative embodiments may be implemented. In an embodiment, the nanowire junction 100 is Josephson junction between a first electrode 102 and a second electrode 104. In some embodiments, the electrodes are superconducting only at cryogenic temperatures. The nanowire junction 100 includes a nanowire 110 formed of indium arsenide (InAs) as a semiconductor link in combination with first and second gate electrodes 106 and 108. The nanowire 110 is crossed by the two gate electrodes 106 and 108 at an intersection that defines a quantum dot 112 location. In some embodiments, below the superconducting transition temperature of the electrodes 102 and 104 (e.g., about 1.1K), the nanowire 110 forms a superconducting weak link. The quantum dot 112 is formed by applying negative voltages to both of the gate electrodes, at which point the current through the dot is a stepwise function of the bias voltage across the electrodes 106 and 108. The stepwise function reflects the single-electron tunneling nature of the device due to electron tunneling via discrete excited states. This and other properties of quantum dots have made them an important area of research because of their potential application in several technology areas, including optical applications and quantum computing.

Figure 2B:
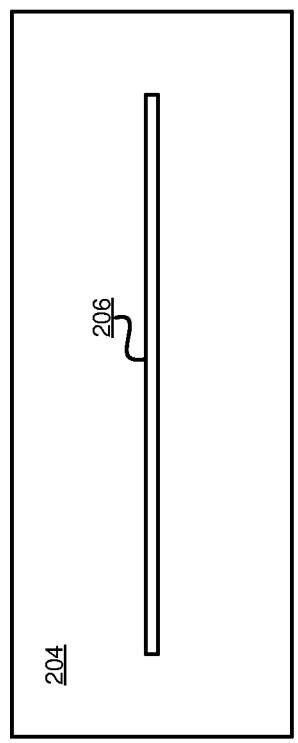
FIG. 2B depicts a plan view of an intermediate structure that includes a nanowire mask in accordance with an illustrative embodiment.

With reference to FIGS. 2A-8B, a fabrication process for fabricating a quantum device includes intermediate structures in accordance with an illustrative embodiment. Referring specifically to FIGS. 2A and 2B, these figures depict cross-sectional and plan views, respectively, of an intermediate structure that includes a mask for patterning non-conducting regions that define a nanowire in a semiconductor layer 202 in accordance with an illustrative embodiment. In the illustrative embodiment, the fabrication of a quantum device includes processing a substrate 200, for example a bulk silicon wafer, a bulk germanium wafer, a bulk III-V wafer such as gallium arsenide or indium phosphide, a silicon on insulator (SOI) substrate, or a strained silicon on insulator (SSOI) substrate.

In the illustrative embodiment, the substrate 200 includes as a semiconductor layer 202. In some embodiments, the semiconductor layer 202 includes a crystalline semiconductor material. Non-limiting examples of suitable materials for the crystalline semiconductor material of the substrate 200 include group IV elements or compounds, such as Si (silicon), strained Si, SiC (silicon carbide), Ge (germanium), SiGe (silicon germanium), SiGeC (silicon-germanium-carbon), Si alloys, or Ge alloys, group III-V compounds, such as GaAs (gallium arsenide), InGaAs (indium gallium arsenide), $In_{0.7}Ga_{0.3}As$, InSb (indium antimonide), InAs (indium arsenide), InP (indium phosphide), or aluminum arsenide (AlAs), group II-VI compounds, such as CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride), or combinations thereof.

In some embodiments, the process includes growing the semiconductor layer 202 using molecular beam epitaxy (MBE) to a thickness in a range suitable for a quantum dot, such as thicknesses less than 1000 nm. For example, some embodiments of the semiconductor layer 202 have a thickness in a range from 1 nm to 500 nm, some embodiments of the semiconductor layer 202 have a thickness in a range from 3 nm to 100 nm, some embodiments of the semiconductor layer 202 have a thickness in a range from 5 nm to 50 nm, and some embodiments of the semiconductor layer 202 have a thickness less than 10 nm, including thicknesses as small as practicable.

In the illustrative embodiment, the process includes forming an insulator layer 204 as a capping layer over the semiconductor layer 202. In an embodiment, the insulator layer 204 includes, for example, indium gallium arsenide, silicon dioxide, aluminum oxide, silicon nitride, or silicon carbide. In an embodiment, the process includes forming the insulator layer 204 using a deposition process, such as chemical vapor deposition (CVD), plasma-enhanced chemical vapor deposition (PECVD), or low-pressure chemical vapor deposition (LPCVD).

In the illustrative embodiment, the process includes forming a mask 206 on the insulator layer 204 and over the semiconductor layer 202. In some embodiments, the mask 206 includes an organic polymer. In some embodiments, the mask 206 includes soft and/or hard mask materials. In some embodiments, the mask 206 comprises an OPL. In some embodiments, the OPL includes a photo-sensitive organic polymer comprising a light-sensitive material that, when exposed to EM radiation, is chemically altered and thus configured to be removed using a developing solvent. For example, in some embodiments, the photo-sensitive organic polymer includes polyacrylate resin, epoxy resin, phenol resin, polyamide resin, polyimide resin, unsaturated polyester resin, polyphenylenether resin, polyphenylenesulfide resin, or benzocyclobutene (BCB).

In some embodiments, the process includes forming the mask 206 over regions of the semiconductor layer 202 that should remain conductive. In some embodiments, the process includes forming the mask 206 over regions of the semiconductor layer 202 that define a nanowire, such as the nanowire 110 shown in FIG. 1. In some embodiments, the process includes forming the mask 206 over selected regions of the insulator layer 204 using deposition, lithography, and etching. In some embodiments, the process includes forming the mask 206 over the insulator layer 204 using photolithography. In some embodiments, the process includes forming the mask 206 over the insulator layer 204 using microlithography for forming features smaller than 10 μm or nanolithography for forming features smaller than 100 nm. For example, in some embodiments, the process includes forming the mask 206 by applying a photoresist layer, exposing the photoresist layer to a pattern of radiation, and then developing the pattern into the mask 206 utilizing resist developer.

With reference to FIG. 3, this figure depicts a cross-sectional view of an intermediate structure that includes nanowire 202A defined by non-conductive regions 202B in accordance with an illustrative embodiment. In the illustrative embodiment, the process includes defining a nanowire 202A by surrounding the boundaries of the desired nanowire with non-conductive regions 202B, followed by removal of the mask 206. In some embodiments, the process includes introducing a gaseous species through regions of the insulator layer 204 and into regions 202B of the semiconductor layer 202 that are not covered by the mask 206. The gaseous species reacts with the regions 202B of the semiconductor layer 202 to create non-conductive regions 202B, or at least reduce the conductivity of the regions 202B. In some embodiments, the process includes removing the mask 206 using a process that removes the material of the mask 206, for example wet etching processes, dry etching processes, or chemical-mechanical planarization (CMP) processes.

For example, in some embodiments, the process includes introducing the gaseous species into the unmasked regions 202B of the semiconductor layer 202 using ion implantation. In some embodiments, the gaseous species includes ions of hydrogen, helium, argon, krypton, and/or neon. In some embodiments, the gaseous species includes H+ ions. In some embodiments, the process includes introducing the gaseous species into the unmasked regions 202B of the semiconductor layer 202 using diffusion or plasma-assisted gasification, for example plasma hydrogenation.

In some embodiments, the process includes controlling the introduction of the gaseous species to penetrate completely through regions of the insulator layer 204 and into regions 202B of the semiconductor layer 202 to a depth of at least half the thickness of the semiconductor layer 202. For example, in some embodiments, the process includes controlling the introduction of the gaseous species to penetrate into regions 202B of the semiconductor layer 202 to a depth of at least 75% of the thickness of the semiconductor layer 202, for example to a depth of at least 90% of the thickness of the semiconductor layer 202 or to a depth of at least 99% of the thickness of the semiconductor layer 202. In some embodiments, the process includes controlling the introduction of the gaseous species to penetrate completely through regions 202B of the insulator layer 204 and completely through regions of the semiconductor layer 202.

Figure 4B:
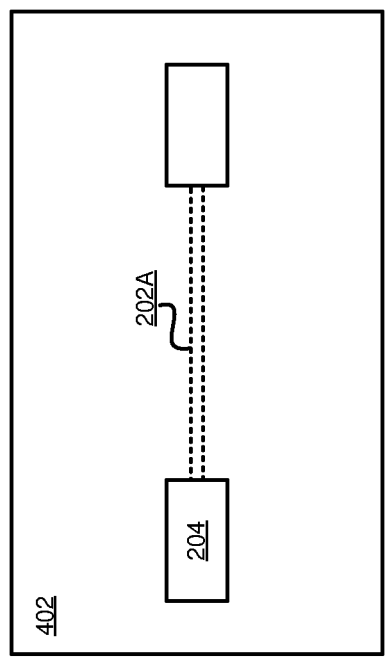
FIG. 4B depicts a plan view of an intermediate structure that includes an electrode mask in accordance with an illustrative embodiment.

With reference to FIGS. 4A-6B, the process includes forming electrodes 502 at opposite ends of the nanowire 202A. Referring specifically to FIGS. 4A and 4B, these figures depict cross-sectional and plan views, respectively, of an intermediate structure that includes a mask 402 for patterning electrodes in accordance with an illustrative embodiment.

In the illustrative embodiment, the process includes forming a mask 402 on the insulator layer 204. In some embodiments, the mask 402 includes an organic polymer. In some embodiments, the mask 402 includes soft and/or hard mask materials. In some embodiments, the mask 402 comprises an OPL. In some embodiments, the OPL includes a photo-sensitive organic polymer comprising a light-sensitive material that, when exposed to EM radiation, is chemically altered and thus configured to be removed using a developing solvent. For example, in some embodiments, the photo-sensitive organic polymer includes polyacrylate resin, epoxy resin, phenol resin, polyamide resin, polyimide resin, unsaturated polyester resin, polyphenylenether resin, polyphenylenesulfide resin, or benzocyclobutene (BCB).

In some embodiments, the process includes forming the mask 402 over the insulator layer 204 except for regions that define patterns for electrodes that will be formed on the insulator layer 204, such as the first and second electrodes 102 and 104 shown in FIG. 1. In some embodiments, the process includes forming the mask 402 over selected regions of the insulator layer 204 using deposition, lithography, and etching. In some embodiments, the process includes forming the mask 402 over the insulator layer 204 using photolithography. In some embodiments, the process includes forming the mask 402 over the insulator layer 204 using microlithography for forming features smaller than 10 μm or nanolithography for forming features smaller than 100 nm. For example, in some embodiments, the process includes forming the mask 402 by applying a photoresist layer, exposing the photoresist layer to a pattern of radiation, and then developing the pattern into the mask 402 utilizing resist developer.

Figure 5B:
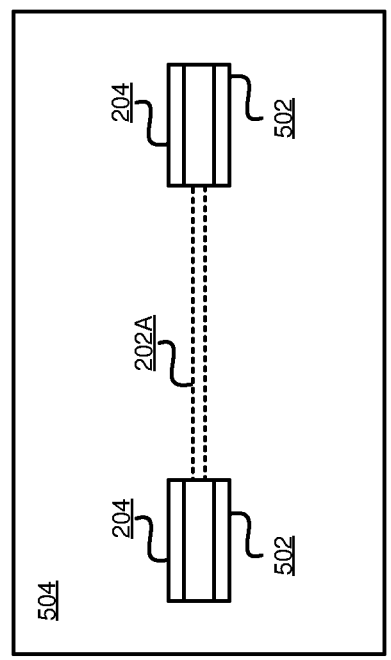
FIG. 5B depicts a plan view of an intermediate structure that includes an electrode mask and deposition layer in accordance with an illustrative embodiment.

With reference to FIGS. 5A and 5B, these figures depict cross-sectional and plan views, respectively, of an intermediate structure that includes metal layers for electrodes 502 and sacrificial structures 504 in accordance with an illustrative embodiment. In some embodiments, the metal layers 502/504 include aluminum (Al), titanium (Ti), tantalum (Ta), tungsten (W), titanium nitride (TiN), V (vanadium), Pb (lead), Sn (tin), Au (gold), Pd (palladium), and Pt (platinum). In some embodiments, the process includes depositing the metal layers 502/504 on the mask 402 and on regions of the insulator layer 204 that are not covered by the mask 402. In some embodiments, the process forms the metal layers 502/504 using evaporation, sputter, or other metal-deposition methods. In some embodiments, the process forms gaps 506 in metal film continuity between the metal in the electrodes 502 and the metal in the sacrificial structures 504 to allow for easier removal of the mask 402 and sacrificial structures 504 by chemical etching.

With reference to FIGS. 6A and 6B, these figures depict cross-sectional and plan views, respectively, of an intermediate structure that includes metal layers for electrodes 502 after removal of the mask 402 and sacrificial structures 504. In some embodiments, the process includes removing the mask 206 and sacrificial structures 504 using a process that removes the material of the mask 206, for example wet etching processes, dry etching processes, or chemical-mechanical planarization (CMP) processes. In some embodiments, the electrodes 502 extend over respective regions of the nanowire 202A to make contact through the insulator layer 204. For example, in some embodiments, the insulator layer 204 thin enough to allow electrical contact therethrough.

Figure 7A:
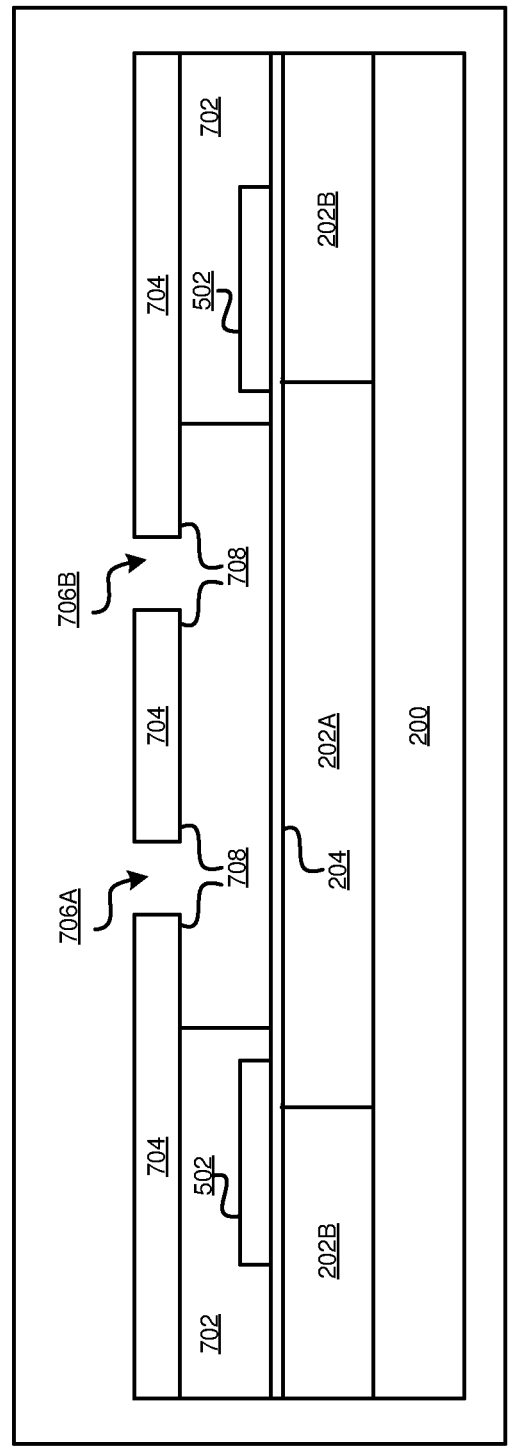
FIG. 7A depicts a cross-sectional view of an intermediate structure that includes a first temporary structure to facilitate oblique deposition in accordance with an illustrative embodiment.
Figure 7B:
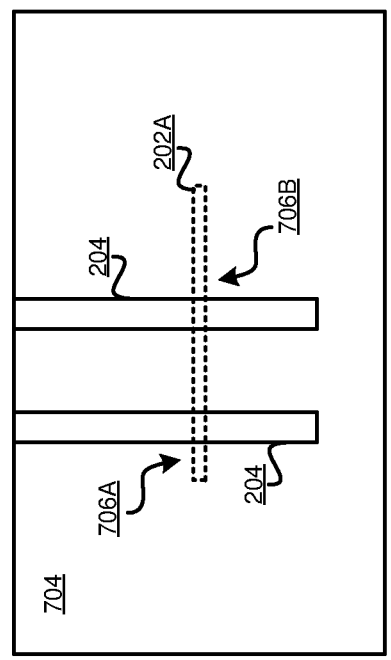
FIG. 7B depicts a plan view of an intermediate structure that includes a first temporary structure to facilitate oblique deposition in accordance with an illustrative embodiment.

With reference to FIGS. 7A and 7B, these figures depict cross-sectional and plan views, respectively, of an intermediate structure that includes a temporary structure to facilitate oblique deposition in accordance with an illustrative embodiment. In the illustrative embodiment, the temporary structure comprises a sacrificial layer 702 formed over the insulator layer 204, and a photoresist layer 704 formed over the sacrificial layer 702 and patterned to define openings 706A and 706B. In some embodiments, the openings 706A and 706B are patterned to allow for formation of gating electrodes, such as gating electrodes 106 and 108 shown in FIG. 1.

In some embodiments, the sacrificial layer 702 comprises one or more layers of developer-soluble bottom anti-reflective coating (DBARC) material formed on the insulator layer 204. In some embodiments, the process includes forming the sacrificial layer 702 from two or more layers of sacrificial material that are sequentially deposited and processed. In some embodiments, process includes forming the sacrificial layer 702 from one or more layers of 90 nm DBARC material, for example by spin coating or other deposition processes. In some embodiments, the photoresist layer 704 includes any suitable commercially available photoresist material.

In some embodiments, the process includes photolithographically patterning the photoresist layer 704 to form a photoresist mask having openings 706A and 706B, and isotropically etching away a portion of the sacrificial layer 702 that is exposed through the openings 706A and 706B of the photoresist layer 704 to form overhang structures 708. In some embodiments, the process includes forming the photoresist layer 704 using known techniques. For example, in some embodiments with a positive resist type, the process includes exposing a portion of the photoresist layer 704 to UV light, for example, through a mask having transparent regions that define a target pattern of metallization lines/features. The portion of the photoresist layer 704 that is exposed to light becomes soluble to a photoresist developer, whereas the portion of the photoresist that is unexposed to UV light remains insoluble to the photoresist developer. Following the exposure process, the photoresist layer 704 is developed using a suitable photoresist developer solution. When the photoresist material is a positive resist type, the portion of the photoresist layer 704 that was exposed to the UV light is dissolved by the photoresist developer solution.

In some embodiments, the process includes utilizing a photoresist developer solution to dissolve portions of the sacrificial layer 702 that are exposed through the openings 706A and 706B of the photoresist layer 704 and form the photoresist overhang structures 708. In some embodiments, the photoresist developer solution used to develop the photoresist layer 704 is also used to dissolve the portions of the sacrificial layer 702. In some such embodiments, the process includes using the photoresist developer solution to develop the photoresist layer 704 for a first period of time equivalent to the development time for development of the photoresist layer 704, then continuing to expose the structure to the photoresist developer solution for a second period of time following the development of the photoresist layer 704 to allow the developer solution to dissolve the portions of the sacrificial layer 702 that are exposed through the openings 706A and 706B and form the photoresist overhang structures 708.

In some such embodiments, the process includes using a photoresist developer solution that isotropically etches the exposed portions of the sacrificial layer 702 in all directions. As such, when the exposed portion of the sacrificial layer 702 is vertically etched, the exposed portion of the sacrificial layer 702 is also laterally etched to form the undercut regions in the sacrificial layer 702 below the photoresist layer 704 around a bottom periphery of the openings 706A and 706B, thereby forming the photoresist overhang structures 708. In some embodiments, the isotropic etching forms curved sidewalls in the sacrificial layer 702 rather than the squared sidewalls shown in the drawings.

With reference to FIGS. 8A and 8B, these figures depict cross-sectional views, respectively, of a deposition process from respective oblique angles in accordance with an illustrative embodiment. In some embodiments, the process includes performing the deposition processes shown in FIGS. 8A and 8B to form electrodes, such as the gating electrodes 106 and 108 shown in FIG. 1. In some embodiments, the deposition process shown in FIG. 8A results in formation of both a first idle electrode 802 and a first gating electrode 804 on the insulator layer 204. In some embodiments, the deposition process shown in FIG. 8B results in formation of both a second gating electrode 810 and a second idle electrode 812 on the insulator layer 204. In some embodiments, the electrodes 802, 804, 810, and 812 are all gating electrodes and the resulting device has three quantum dots.

In some embodiments, the electrodes 802, 804, 810, and 812 include metal, for example aluminum (Al), titanium (Ti), tantalum (Ta), tungsten (W), titanium nitride (TiN), V (vanadium), Pb (lead), Sn (tin), Au (gold), Pd (palladium), and Pt (platinum). In some embodiments, the process includes depositing the metal electrodes 802, 804, 810, and 812 through the openings 706A and 706B in the photoresist layer 704. More specifically, in some embodiments, the electrodes 802 and 804 are formed concurrently during a first deposition process with the substrate plane or upper surface of the photoresist layer 704 being at a first angle $\alpha_1$ relative to a deposition direction, and the electrodes 810 and 812 are formed concurrently during a second deposition process with the substrate plane or upper surface of the photoresist layer 704 being at a second angle $\alpha_2$ relative to a deposition direction. In some embodiments, the angles $\alpha_1$ and $\alpha_2$ are supplementary angles, i.e., $\alpha_1+\alpha_2=180°$. In some embodiments, the angles $\alpha_1$ and $\alpha_2$ are not supplementary angles. In some embodiments, the process adjusts the angle of deposition by adjusting the angle of the substrate 200 (e.g., tilting the substrate) while keeping the direction from which metal is deposited fixed. In some embodiments, the process adjusts the angle of deposition by adjusting the direction from which metal is deposited while keeping the angle of the substrate 200 fixed. In some embodiments, the process adjusts the angle of deposition by adjusting both the direction from which metal is deposited and the angle of the substrate 200.

In some embodiments, the angles $\alpha_1$ and $\alpha_2$ are selected based on the desired size and placement of the electrodes 802, 804, 810, and 812. In some embodiments, the process includes adjusting the deposition angle relative to the upper surface of the photoresist layer 704 in order to adjust the at least one dimension of the deposition window defined by the openings 706A and 706B, and thereby adjust at least one dimension of the electrodes formed by the deposition process. For example, in the illustrated embodiment, for the angle $\alpha_1$ satisfying the condition $0°\leq\alpha_1\leq90°$, the width of the electrodes 802 and 804 gets smaller as the angle $\alpha_1$ gets smaller.

In some embodiments, the process includes controlling the locations of the electrodes by adjusting the deposition angles $\alpha_1$ and $\alpha_2$. For example, for a deposition angle set such that $\alpha_1=90°$, the resulting electrode would be formed on the insulator layer 204 directly below the opening 706A or 706B. As the angle $\alpha_1$ is reduced from 90° towards 0°, the resulting electrode location moves away from alignment with an opening 706A or 706B and towards a position between the insulator layer 204 and an overhang structure 708. Also, since the position of the electrodes can be controlled by adjusting the angles $\alpha_1$ and $\alpha_2$, the distance between the gating electrodes 804 and 810 can also be controlled by adjusting the deposition angles $\alpha_1$ and $\alpha_2$. For example, in some embodiments, the process controls the size of the gap between gating electrodes 804 and 810 for a quantum dot by adjusting the angles used for the respective deposition angles $\alpha_1$ and $\alpha_2$. Thus, embodiments can finely control the size of the electrodes and/or the gap between electrodes by controlling the deposition angles.

In the illustrated embodiment, the process uses each of the openings 706A and/or 706B in the photoresist layer 704 to form more than one electrode. For example, the opening 706A is used to form electrode 802 and then to form electrode 810, which are laterally spaced apart from each other on the insulator layer 204. Also, the opening 706B is used to form electrode 804 and then to form electrode 812, which are laterally spaced apart from each other on the insulator layer 204.

Figure 9A:
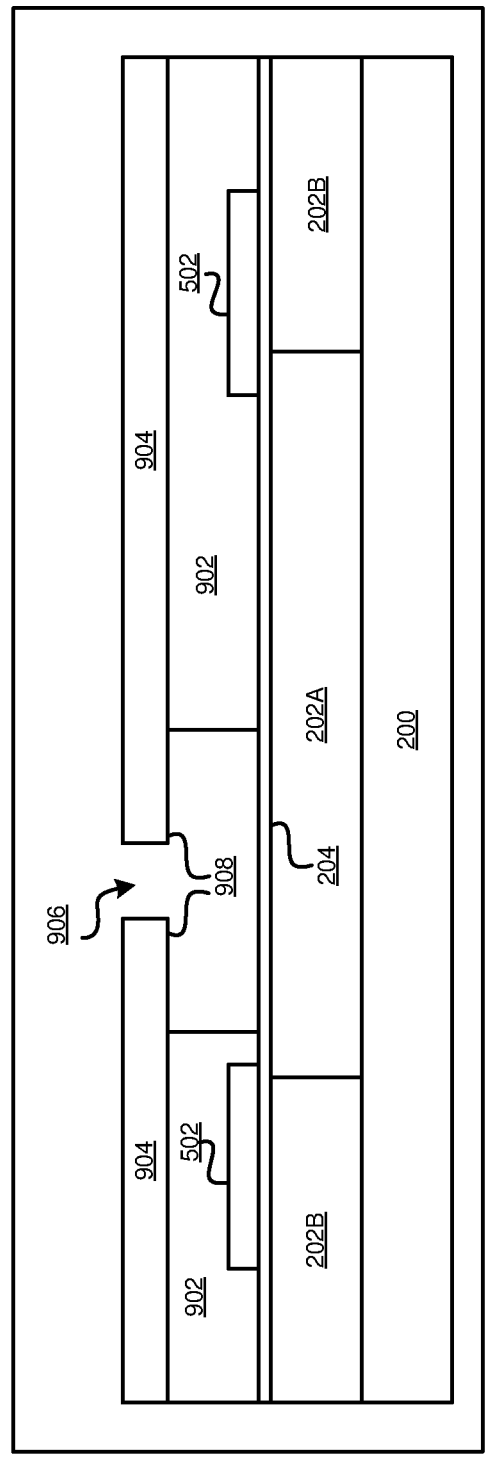
FIG. 9A depicts a cross-sectional view of an intermediate structure that includes a second temporary structure to facilitate oblique deposition in accordance with an illustrative embodiment.

With reference to FIGS. 9A and 9B, these figures depict cross-sectional and plan views, respectively, of an intermediate structure that includes a temporary structure to facilitate angled deposition in accordance with an illustrative embodiment. In the illustrative embodiment, the temporary structure comprises a sacrificial layer 902 formed over the insulator layer 204, and a photoresist layer 904 formed over the sacrificial layer 902 and patterned to define an opening 906. In some embodiments, the opening 906 is patterned to allow for formation of gating electrodes, such as gating electrodes 106 and 108 shown in FIG. 1.

In some embodiments, the sacrificial layer 902 comprises one or more layers of developer-soluble bottom anti-reflective coating (DBARC) material formed on the insulator layer 204. In some embodiments, the process includes forming the sacrificial layer 902 from two or more layers of sacrificial material that are sequentially deposited and processed. In some embodiments, process includes forming the sacrificial layer 902 from one or more layers of 90 nm DBARC material, for example by spin coating or other deposition processes. In some embodiments, the photoresist layer 904 includes any suitable commercially available photoresist material.

In some embodiments, the process includes photolithographically patterning the photoresist layer 904 to form a photoresist mask having an opening 906, and isotropically etching away a portion of the sacrificial layer 902 that is exposed through the opening 906 of the photoresist layer 904 to form overhang structures 908. In some embodiments, the process includes forming the photoresist layer 904 using known techniques. For example, in some embodiments with a positive resist type, the process includes exposing a portion of the photoresist layer 904 to UV light, for example, through a mask having transparent regions that define a target pattern of metallization lines/features. The portion of the photoresist layer 904 that is exposed to light becomes soluble to a photoresist developer, whereas the portion of the photoresist that is unexposed to UV light remains insoluble to the photoresist developer. Following the exposure process, the photoresist layer 904 is developed using a suitable photoresist developer solution. When the photoresist material is a positive resist type, the portion of the photoresist layer 904 that was exposed to the UV light is dissolved by the photoresist developer solution.

In some embodiments, the process includes utilizing a photoresist developer solution to dissolve portions of the sacrificial layer 902 that are exposed through the opening 906 of the photoresist layer 904 and form the photoresist overhang structures 908. In some embodiments, the photoresist developer solution used to develop the photoresist layer 904 is also used to dissolve the portions of the sacrificial layer 902. In some such embodiments, the process includes using the photoresist developer solution to develop the photoresist layer 904 for a first period of time equivalent to the development time for development of the photoresist layer 904, then continuing to expose the structure to the photoresist developer solution for a second period of time following the development of the photoresist layer 904 to allow the developer solution to dissolve the portions of the sacrificial layer 902 that are exposed through the opening 906 and form the photoresist overhang structures 908.

In some such embodiments, the process includes using a photoresist developer solution that isotropically etches the exposed portions of the sacrificial layer 902 in all directions. As such, when the exposed portion of the sacrificial layer 902 is vertically etched, the exposed portion of the sacrificial layer 902 is also laterally etched to form the undercut regions in the sacrificial layer 902 below the photoresist layer 904 around a bottom periphery of the opening 906, thereby forming the photoresist overhang structures 908. In some embodiments, the isotropic etching forms curved sidewalls in the sacrificial layer 902 rather than the squared sidewalls shown in the drawings.

Figure 10A:
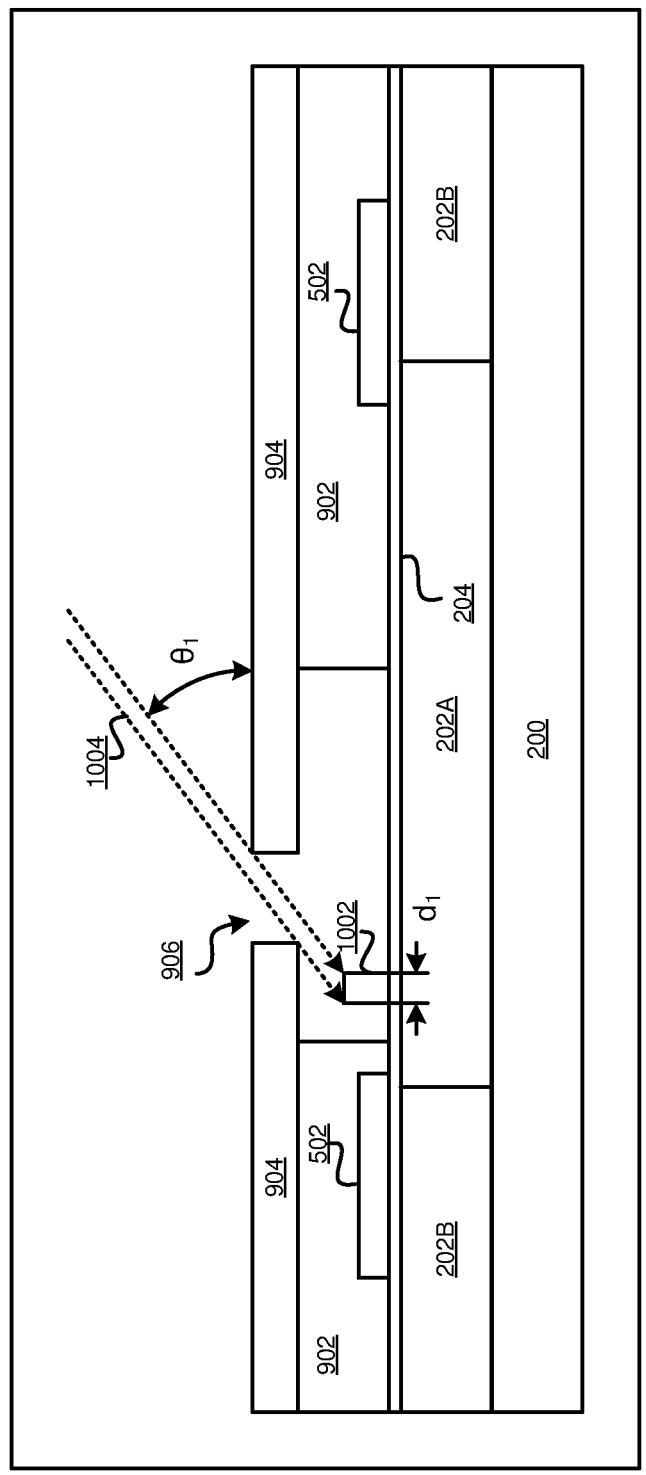
FIG. 10A depicts a cross-sectional view of an intermediate structure undergoing a deposition process from a first oblique angle in accordance with an illustrative embodiment.

With reference to FIGS. 10A and 10B, these figures depict cross-sectional views, respectively, of a deposition process from respective angles in accordance with an illustrative embodiment. In some embodiments, the process includes performing the deposition processes shown in FIGS. 10A and 10B to form electrodes, such as the gating electrodes 106 and 108 shown in FIG. 1. In some embodiments, the deposition process shown in FIG. 10A results in formation of a first gating electrode 1002 on the insulator layer 204. In some embodiments, the deposition process shown in FIG. 10B results in formation of a second gating electrode 1006 on the insulator layer 204. In some embodiments, the electrodes 1002 and 1006 are gating electrodes and the resulting device has a quantum dot between the electrodes 1002 and 1006.

In some embodiments, the electrodes 1002 and 1006 include metal, for example aluminum (Al), titanium (Ti), tantalum (Ta), tungsten (W), titanium nitride (TiN), V (vanadium), Pb (lead), Sn (tin), Au (gold), Pd (palladium), and Pt (platinum). In some embodiments, the process includes depositing the metal electrodes 1002 and 1006 through the opening 906 in the photoresist layer 904. More specifically, in some embodiments, the electrode 1002 is formed during a first deposition process with the substrate plane or upper surface of the photoresist layer 904 being at a first angle $\theta_1$ relative to a deposition direction, and the electrode 1006 is formed during a second deposition process with the substrate plane or upper surface of the photoresist layer 904 being at a second angle $\theta_2$ relative to a deposition direction. In some embodiments, the process adjusts the angle of deposition by adjusting the angle of the substrate 200 (e.g., tilting the substrate) while keeping the direction from which metal is deposited fixed. In some embodiments, the process adjusts the angle of deposition by adjusting the direction from which metal is deposited while keeping the angle of the substrate 200 fixed. In some embodiments, the process adjusts the angle of deposition by adjusting both the direction from which metal is deposited and the angle of the substrate 200.

In some embodiments, the angles $\theta_1$ and $\theta_2$ are selected based on the desired size and placement of the electrodes 1002 and 1006. In some embodiments, the process includes adjusting the deposition angle relative to the upper surface of the photoresist layer 904 in order to adjust the at least one dimension of the deposition window defined by the opening 906, and thereby adjust at least one dimension of the electrodes formed by the deposition process. For example, in the illustrated embodiment, for the angle $\theta_1$ satisfying the condition $0° \leq \theta_1 \leq 90°$, the width of the electrodes 1002 and 1006 gets smaller as the angle $\theta_1$ gets smaller.

In some embodiments, the process includes controlling the locations of the electrodes by adjusting the deposition angles $\theta_1$ and $\theta_2$. For example, for a deposition angle set such that $\theta_1=90°$, the resulting electrode would be formed on the insulator layer 204 directly below the opening 906. As the angle $\theta_1$ is reduced from 90° towards 0°, the resulting electrode location moves away from alignment with opening 906 and towards a position between the insulator layer 204 and an overhang structure 908. Also, since the position of the electrodes can be controlled by adjusting the angles $\theta_1$ and $\theta_2$, the distance between the gating electrodes 1002 and 1006 can also be controlled by adjusting the deposition angles $\theta_1$ and $\theta_2$. For example, in some embodiments, the process controls the size of the gap between gating electrodes 1002 and 1006 for a quantum dot by adjusting the angles used for the respective deposition angles $\theta_1$ and $\theta_2$. Thus, embodiments can finely control the size of the electrodes and/or the gap between electrodes by controlling the deposition angles.

In the illustrated embodiment, the process uses the opening 906 in the photoresist layer 904 to form more than one electrode. For example, the opening 906 is used to form electrode 1002 and then to form electrode 1006, which are laterally spaced apart from each other on the insulator layer 204.

With reference to FIG. 11 this figure depicts a flowchart of an example process 1100 for fabricating a nanowire junction for a quantum device in accordance with an illustrative embodiment. In an embodiment, at block 1102, the process forms first and second electrodes over a substrate that includes a semiconductor region that extends between the first and second electrodes such that portions of the electrodes overlap respective regions of the semiconductor region. Next, at block 1104, the process forms a mask structure over the substrate such that the mask covers the first and second electrodes and defines an opening over a portion of the semiconductor region and such that the mask defines at least one overhang portion that defines an upper boundary of a gap between the substrate and the mask. Next, at block 1106, the process performs a first deposition process that deposits metal through the opening and over the semiconductor region from a first angle that is less than 90 degrees from the substrate, thereby forming a first gate electrode. Next, at block 1108, the process performs a second deposition process that deposits metal some distance from the first gate electrode through the opening and over the semiconductor region from a second angle from the substrate, thereby forming a second gate electrode some distance from the first gate electrode.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Thus, a computer implemented method, system or apparatus, and computer program product are provided in the illustrative embodiments for managing participation in online communities and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Embodiments of the present invention may also be delivered as part of a service engagement with a client corporation, nonprofit organization, government entity, internal organizational structure, or the like. Aspects of these embodiments may include configuring a computer system to perform, and deploying software, hardware, and web services that implement, some or all of the methods described herein. Aspects of these embodiments may also include analyzing the client's operations, creating recommendations responsive to the analysis, building systems that implement portions of the recommendations, integrating the systems into existing processes and infrastructure, metering use of the systems, allocating expenses to users of the systems, and billing for use of the systems. Although the above embodiments of present invention each have been described by stating their individual advantages, respectively, present invention is not limited to a particular combination thereof. To the contrary, such embodiments may also be combined in any way and number according to the intended deployment of present invention without losing their beneficial effects.

What is claimed is:

1. A method comprising:
    forming first and second electrodes over a substrate that includes a nanowire that extends between the first and second electrodes,
    wherein portions of the first and second electrodes overlap respective first and second regions of the nanowire;
    forming a mask structure over the substrate and the first and second electrodes,
    wherein the mask structure defines at least one opening over a portion of the nanowire, and
    wherein the mask structure defines at least one overhang portion that defines a boundary of a gap between the substrate and the mask;
    depositing a first gate electrode on the substrate and overlapping a third region of the nanowire,
    wherein the depositing of the first gate electrode includes depositing conductive material through the at least one opening from a first oblique angle from a surface of the substrate; and
    depositing a second gate electrode on the substrate and overlapping a fourth region of the nanowire,
    wherein the depositing of the second gate electrode includes depositing conductive material through the at least one opening from a second oblique angle from the surface of the substrate.

2. The method of claim 1, wherein the first and second electrodes comprise at least one member selected from a set of aluminum (Al), titanium (Ti), tantalum (Ta), tungsten (W), titanium nitride (TiN), V (vanadium), Pb (lead), Sn (tin), Au (gold), Pd (palladium), and Pt (platinum).

3. The method of claim 1, wherein the first and second electrodes are superconducting only at cryogenic temperatures.

4. The method of claim 1, wherein the nanowire comprises at least one member selected from a set of Si (silicon), strained Si, SiC (silicon carbide), Ge (germanium), SiGe (silicon germanium), SiGeC (silicon-germanium-carbon), Si alloys, Ge alloys, GaAs (gallium arsenide), InGaAs (indium gallium arsenide), In0.7Ga0.3As, InSb (indium antimonide), InAs (indium arsenide), InP (indium phosphide), AlA (aluminum arsenide), CdSe (cadmium selenide), CdS (cadmium sulfide), CdTe (cadmium telluride), ZnO (zinc oxide), ZnSe (zinc selenide), ZnS (zinc sulfide), and ZnTe (zinc telluride).

5. The method of claim 1, further comprising forming the nanowire in the substrate prior to forming the first and second electrodes.

6. The method of claim 5, wherein the forming of the nanowire in the substrate comprises forming a mask over a layer of semiconductor material, wherein the mask defines a shape of the nanowire.

7. The method of claim 6, further comprising forming an insulator layer over the semiconductor material before forming the nanowire, wherein the forming of the mask over the layer of semiconductor material incudes forming the mask over the insulator layer.

8. The method of claim 1, further comprising selecting the first oblique angle based on a desired dimension of the first gate electrode.

9. The method of claim 1, further comprising selecting the first oblique angle based on a desired location of the first gate electrode.

10. The method of claim 1, further comprising selecting the first oblique angle based on a desired gap between the first and second gate electrodes.

11. The method of claim 1, wherein the at least one opening includes a first opening, and wherein the depositing of the first gate electrode includes depositing conductive material through the first opening.

12. The method of claim 11, wherein the depositing of the second gate electrode includes depositing conductive material through the first opening.

13. The method of claim 11, wherein the at least one opening includes a second opening, and wherein the depositing of the second gate electrode includes depositing conductive material through the second opening.

14. The method of claim 1, wherein the forming of the mask structure includes forming a sacrificial layer over the substrate and the first and second electrodes, wherein the sacrificial layer comprises a developer-soluble material.

15. The method of claim 14, wherein the forming of the mask structure includes:
   forming a photoresist layer over the sacrificial layer; and
   patterning the photoresist layer to define the at least one opening over the portion of the nanowire.

16. The method of claim 15, wherein the forming of the mask structure includes isotropically etching away a first portion of the sacrificial layer that is exposed through the opening.

17. The method of claim 16, wherein the isotropical etching away of the portion of the sacrificial layer includes laterally etching away a second portion of the sacrificial layer from between the substrate and the photoresist layer.

18. The method of claim 17, wherein the photoresist layer is used for forming the first and second gate electrodes during respective deposition processes as first and second electrodes of a same quantum dot.

19. A quantum device comprising:
   first and second electrodes formed over a substrate that includes a nanowire that extends between the first and second electrodes,
   wherein portions of the first and second electrodes overlap respective first and second regions of the nanowire;
   a first gate electrode deposited on the substrate and overlapping a third region of the nanowire; and
   a second gate electrode deposited on the substrate and overlapping a fourth region of the nanowire;
   wherein at least one of a first dimension of the first gate electrode, a second dimension of the second gate electrode, and a third dimension of a gap between the first and second gate electrodes is based on at least one of:
   a size of at least one opening defined by a mask structure temporarily formed over the substrate;
   a first oblique angle from a surface of the substrate used for depositing the first gate electrode through the at least one opening; and
   a second oblique angle from the surface of the substrate used for depositing the second gate electrode through the at least one opening.

20. A computer system comprising a processor, one or more computer-readable memories, and one or more computer-readable storage mediums, and program instructions stored on at least one of the one or more storage mediums for execution by at least one of the one or more processors via at least one of the one or more memories, the stored program instructions comprising:
   program instructions for forming, by the processor, first and second electrodes over a substrate that includes a nanowire that extends between the first and second electrodes,
   wherein portions of the first and second electrodes overlap respective first and second regions of the nanowire;
   program instructions for forming, by the processor, a mask structure over the substrate and the first and second electrodes,
   wherein the mask structure defines at least one opening over a portion of the nanowire, and
   wherein the mask structure defines at least one overhang portion that defines a boundary of a gap between the substrate and the mask;
   program instructions for depositing, by the processor, a first gate electrode on the substrate and overlapping a third region of the nanowire,
   wherein the depositing of the first gate electrode includes depositing conductive material through the at least one opening from a first oblique angle from a surface of the substrate; and
   program instructions for depositing, by the processor, a second gate electrode on the substrate and overlapping a fourth region of the nanowire,
   wherein the depositing of the second gate electrode includes depositing conductive material through the at least one opening from a second oblique angle from the surface of the substrate.

\* \* \* \* \*